United States Patent
Nishida et al.

(10) Patent No.: US 10,181,644 B2
(45) Date of Patent: Jan. 15, 2019

(54) ANTENNA CIRCUIT AND COMMUNICATION DEVICE

(71) Applicant: Murata Manufacturing Co., Ltd., Nagaokakyo-shi, Kyoto-fu (JP)

(72) Inventors: Hiroshi Nishida, Nagaokakyo (JP); Kenichi Ishizuka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/921,700

(22) Filed: Mar. 15, 2018

(65) Prior Publication Data

US 2018/0205149 A1 Jul. 19, 2018

Related U.S. Application Data

(63) Continuation of application No. PCT/JP2016/080162, filed on Oct. 12, 2016.

(30) Foreign Application Priority Data

Oct. 16, 2015 (JP) ................................. 2015-204610

(51) Int. Cl.
| | |
|---|---|
| *H01Q 5/335* | (2015.01) |
| *H01F 17/00* | (2006.01) |
| *H01F 27/00* | (2006.01) |
| *H01Q 1/50* | (2006.01) |
| *H01Q 9/04* | (2006.01) |

(Continued)

(52) U.S. Cl.
CPC ............. *H01Q 5/335* (2015.01); *H01F 17/00* (2013.01); *H01F 27/00* (2013.01); *H01F 27/2804* (2013.01); *H01Q 1/243* (2013.01); *H01Q 1/50* (2013.01); *H01Q 5/10* (2015.01); *H01Q 5/328* (2015.01); *H01Q 9/04* (2013.01); *H04B 1/40* (2013.01); *H04B 1/401* (2013.01);

(Continued)

(58) Field of Classification Search
CPC ............................... H01Q 5/335; H01Q 5/328
See application file for complete search history.

(56) References Cited

U.S. PATENT DOCUMENTS

| | | | | |
|---|---|---|---|---|
| 6,323,811 | B1 * | 11/2001 | Tsubaki | H01Q 1/243 343/700 MS |
| 2014/0203992 | A1 * | 7/2014 | Nakano | H01Q 7/00 343/867 |
| 2015/0178434 | A1 | 6/2015 | Ishizuka et al. | |

FOREIGN PATENT DOCUMENTS

| | | |
|---|---|---|
| JP | 2012-160817 A | 8/2012 |
| WO | 01/24316 A1 | 4/2001 |
| WO | 2014/050482 A1 | 4/2014 |

OTHER PUBLICATIONS

Official Communication issued in International Patent Application No. PCT/JP2016/080162, dated Dec. 27, 2016.

* cited by examiner

*Primary Examiner* — Tuan H Nguyen
(74) *Attorney, Agent, or Firm* — Keating & Bennett, LLP

(57) ABSTRACT

An antenna circuit includes a radiation conductor, a matching circuit disposed between a feeding port in the radiation conductor and a feeder circuit, and a frequency-characteristics adjusting circuit connected between a frequency-characteristics adjustment port in the radiation conductor and a ground and including a variable reactance circuit. The matching circuit includes a first inductance element connected in shunt. The frequency-characteristics adjusting circuit includes a second inductance element. The first inductance element and the second inductance element are magnetically coupled to each other.

20 Claims, 13 Drawing Sheets

(51) Int. Cl.
*H04B 1/40* (2015.01)
*H01Q 5/10* (2015.01)
*H01Q 5/328* (2015.01)
*H01F 27/28* (2006.01)
*H01Q 1/24* (2006.01)
*H04B 1/401* (2015.01)
*H03H 7/38* (2006.01)
*H04M 1/725* (2006.01)

(52) U.S. Cl.
CPC ....... *H01F 2027/2809* (2013.01); *H03H 7/38* (2013.01); *H04M 1/72519* (2013.01)

Freq.(0.60GHz to 1.00GHz)

Freq. [GHz]

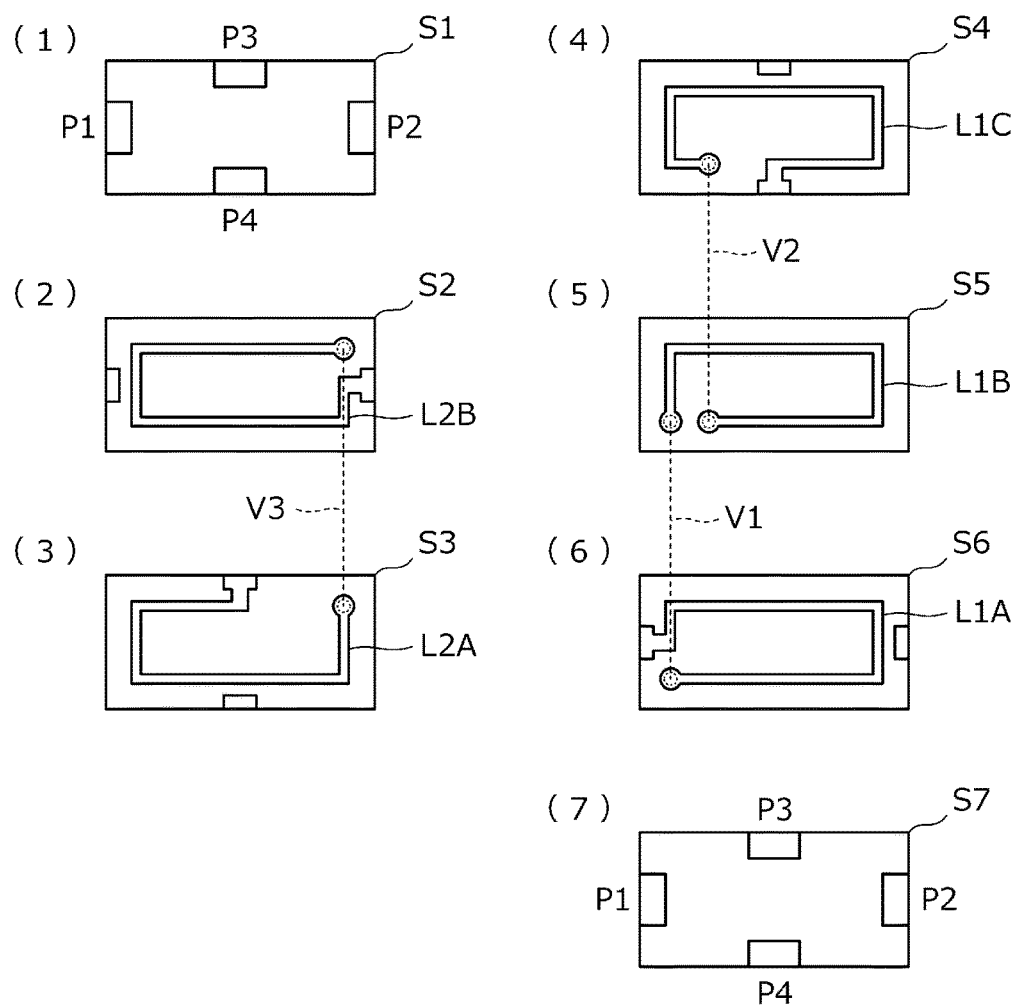

Freq.(0.60GHz to 1.00GHz)

ANTENNA CIRCUIT AND COMMUNICATION DEVICE

CROSS REFERENCE TO RELATED APPLICATIONS

This application claims the benefit of priority to Japanese Patent Application No. 2015-204610 filed on Oct. 16, 2015 and is a Continuation Application of PCT Application No. PCT/JP2016/080162 filed on Oct. 12, 2016. The entire contents of each application are hereby incorporated herein by reference.

BACKGROUND OF THE INVENTION

1. Field of the Invention

The present invention relates to an antenna circuit having variable frequency characteristics and a communication device including the antenna circuit.

2. Description of the Related Art

An antenna circuit in which a feeder circuit is connected to a feeding port in a single radiation electrode and a variable reactance circuit is connected to a frequency-characteristics adjustment port spaced apart from the feeding port is illustrated in Japanese Unexamined Patent Application Publication No. 2012-160817.

A fundamental configuration of the above-described antenna circuit is illustrated in FIG. 13. In this antenna circuit, a matching circuit 30 is connected between a ground conductor 11 and a connection portion of a feeding port 10F in a radiation conductor 10 and a feeder circuit 20. A frequency-characteristics adjusting circuit 40 is connected between a frequency-characteristics adjustment port 10C in the radiation conductor 10 and the ground conductor 11. The frequency-characteristics adjusting circuit 40 is a circuit that switches reactance, and this switching of the reactance switches the frequency characteristics of the antenna.

When the reactance of the frequency-characteristics adjusting circuit 40, which is connected in shunt with the frequency-characteristics adjustment port, as illustrated in FIG. 13, is switched, the resonance characteristics of the radiation conductor 10 varies.

FIGS. 14A and 14B illustrate the frequency characteristics of the antenna circuit illustrated in FIG. 13. FIG. 14A illustrates a reflection coefficient viewed from the feeder circuit 20 toward the radiation conductor 10 in FIG. 13 on a Smith chart, and FIG. 14B illustrates frequency characteristics of its return loss. Curves L in FIGS. 14A and 14B represent characteristics in a case in which the frequency is swept when the frequency-characteristics adjusting circuit 40 is in a first state (a state in which an inductive reactance is large). Curves H in FIGS. 14A and 14B represent characteristics in a case in which the frequency is swept when the frequency-characteristics adjusting circuit 40 is in a second state (a state in which the inductive reactance is small).

In the example illustrated in FIG. 14A, when the frequency-characteristics adjusting circuit 40 is in the first state, the resonant frequency of the radiation conductor 10 is 730 MHz, and the band width at a return loss of −4 dB is 105 MHz. When the frequency-characteristics adjusting circuit 40 is in the second state, the resonant frequency of the radiation conductor 10 is 930 MHz, and the band width at a return loss of −4 dB is 71 MHz.

Thus, a change in the reactance of the frequency-characteristics adjusting circuit 40 causes both of the resonant frequency of the radiation conductor 10 and the band width to vary. In the example illustrated in FIGS. 14A and 14B, matching is done in a wide band in the first state, whereas narrow-band characteristics are exhibited in the second state. That is, the depth of the matching in a band in which the center frequency is 730 MHz is moderately shallow, but that in a band in which the center frequency is 930 MHz is too deep.

SUMMARY OF THE INVENTION

Preferred embodiments of the present invention provide antenna circuits capable of reducing or preventing changes in a matching state caused by switching of a resonant frequency and capable of performing matching over a wide band and a communication device including the antenna circuit.

An antenna circuit according to a preferred embodiment of the present invention includes a radiation conductor, a matching circuit disposed between a feeding port in the radiation conductor and a feeder circuit, and a frequency-characteristics adjusting circuit connected between a frequency-characteristics adjustment port in the radiation conductor and a ground and including a variable reactance circuit.

The matching circuit includes a first inductance element connected in shunt. The frequency-characteristics adjusting circuit includes a second inductance element. The first inductance element and the second inductance element are magnetically coupled to each other.

The depth of matching by the matching circuit is primarily defined by the effective reactance of the first inductance element. With the above-described configuration, a current flowing in the frequency-characteristics adjusting circuit changes the effective reactance of the first inductance element. Accordingly, as the reactance of the frequency-characteristics adjusting circuit varies and the resonant frequency varies, the depth of matching varies. This configuration achieves a necessary frequency band width even when the resonant frequency varies.

In an antenna circuit according to a preferred embodiment of the present invention, the first inductance element and the second inductance element may preferably be coupled with polarity at which their inductances are increased. With this configuration, the direction in which the current flowing in the frequency-characteristics adjusting circuit increases and decreases and the direction in which the first inductance increases and decreases coincide with each other.

In an antenna circuit according to a preferred embodiment of the present invention, the variable reactance circuit may include a plurality of reactance elements and a switch that selects one of the plurality of reactance elements, and the second inductance element may be connected between the switch and the frequency-characteristics adjustment port in the radiation conductor. With this configuration, the variable reactance circuit is able to be provided without a variable reactance element. The coupling between the first inductance element and the second inductance element is able to be maintained regardless of what element is selected by the switch.

In an antenna circuit according to a preferred embodiment of the present invention, the variable reactance circuit may include a plurality of reactance elements and a switch that selects one of the plurality of reactance elements, and the second inductance element may be connected between the switch and the ground. With this configuration, the variable reactance circuit is able to be provided without a variable reactance element. Because a state in which the first inductance element and the second inductance element are not coupled is allowed, a necessary coefficient of coupling between the first inductance element and the second inductance element is able to be reduced by increasing the inductance of the second inductance element.

In an antenna circuit according to a preferred embodiment of the present invention, a first end of the second inductance element may be grounded, and the antenna circuit may further include a transmission line connected between the switch and a second end of the second inductance element.

In an antenna circuit according to a preferred embodiment of the present invention, a first end of the first inductance element may be grounded, and the antenna circuit may further include a transmission line connected between the feeder circuit or the feeding port and a second end of the first inductance element. With this configuration, changes in characteristics dependent on the presence or absence of the transmission line are small.

In an antenna circuit according to a preferred embodiment of the present invention, the first inductance element and the second inductance element may include a plurality of dielectric bases that are laminated and conductive patterns on the plurality of dielectric bases, and a one-chip component including the first inductance element and the second inductance element may preferably be provided. With this configuration, the first inductance element and the second inductance element coupled with a predetermined high coefficient of coupling is provided. An actual number of components is able to be reduced.

A communication device according to a preferred embodiment of the present invention includes an antenna circuit and a feeder circuit connected to the antenna circuit.

The antenna circuit includes a radiation conductor, a matching circuit disposed between a feeding port in the radiation conductor and a feeder circuit, and a frequency-characteristics adjusting circuit connected between a frequency-characteristics adjustment port in the radiation conductor and a ground and including a variable reactance circuit.

The matching circuit includes a first inductance element connected in shunt. The frequency-characteristics adjusting circuit includes a second inductance element. The first inductance element and the second inductance element are magnetically coupled to each other.

With the above-described configuration, because a necessary frequency band width is able to be achieved even when control by the frequency-characteristics adjusting circuit causes the resonant frequency to vary, the communication device capable of establishing communications over a wide band is provided.

According to preferred embodiments of the present invention, antenna circuits capable of reducing or preventing changes in a matching state caused by switching of a resonant frequency and a communication device including the antenna circuit are obtained.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 includes plan views of layers in the transformer TF.

DETAILED DESCRIPTION OF THE PREFERRED EMBODIMENTS

Figure 1:
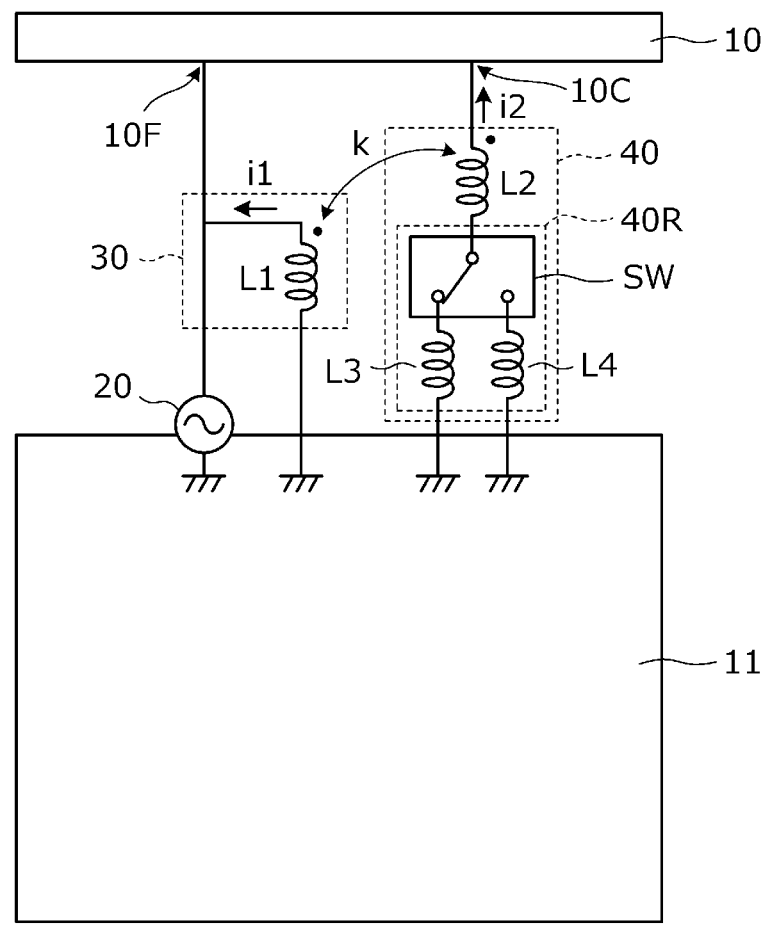
FIG. 1 illustrates a circuit configuration of an antenna circuit 101 according to a first preferred embodiment of the present invention.

A plurality of preferred embodiments of the present invention are described below using some specific examples with reference to the drawings. The same reference numerals are used in the same portions in the drawings. For explaining the main points or facilitating the understanding, the preferred embodiments are illustrated separately for the sake of convenience, and configurations illustrated in different preferred embodiments may be partially replaced or combined. Matters in a second and subsequent preferred embodiments common to those in a first preferred embodiment are not described, and only different points are described. In particular, the same or substantially the same operational effects produced by substantially the same configurations are not described for each preferred embodiment.

First Preferred Embodiment

FIG. 1 illustrates a circuit configuration of an antenna circuit 101 according to a first preferred embodiment of the present invention. The antenna circuit 101 includes a radiation conductor 10, a matching circuit 30, and a frequency-characteristics adjusting circuit 40.

The matching circuit 30 is disposed between a feeding port 10F in the radiation conductor 10 and a feeder circuit 20. In the present preferred embodiment, the matching circuit 30 includes a first inductance element L1 connected in shunt to a ground from a feeding line to the feeding port 10F.

The frequency-characteristics adjusting circuit 40 is disposed between a frequency-characteristics adjustment port 10C in the radiation conductor 10 and a ground conductor 11. The frequency-characteristics adjusting circuit 40 includes a second inductance element L2, a third inductance element L3, a fourth inductance element L4, and a switch SW. The third inductance element L3, the fourth inductance element L4, and the switch SW define a variable reactance circuit 40R.

The first inductance element L1 and the second inductance element L2 are magnetically coupled to each other. The first inductance element L1 and the second inductance element L2 are preferably coupled with polarity at which their inductances are increased, for example. As described below, the first inductance element L1 and second inductance element L2 preferably define a transformer with a one-chip component structure, for example.

As illustrated in FIG. 1, when a current i1 flows to the first inductance element L1 in a direction from the ground conductor 11 towards the radiation conductor 10, a current i2 flows to the second inductance element L2 in the direction from the ground conductor 11 towards the radiation conductor 10. The first inductance element L1 and the second inductance element L2 may be considered to define a subtractive polarity transformer.

Here, when the inductance of the first inductance element L1 is expressed as l1, the inductance of the second inductance element L2 is expressed as l2, the coefficient of coupling between the first inductance element L1 and the second inductance element L2 is expressed as k, and the mutual inductance arising from that coupling is expressed as M12, the effective inductance l1a of the first inductance element L1 included in the matching circuit 30 is represented by the following expressions:

$$l1a = l1 + M12(i2/i1)$$

$$M12 = k\sqrt{(l1 \cdot l2)}$$

Because the coefficient k of coupling is a positive value, the effective inductance l1a of the first inductance element L1 is increased by M12(i2/i1) due to the coupling to the second inductance element L2.

The third inductance element L3 and the fourth inductance element L4 have different inductances. The inductance of the variable reactance circuit 40R is switched by the switch SW. By increasing the inductance of the variable reactance circuit 40R, the resonant frequency of the radiation conductor 10 is switched. In the present preferred embodiment, as one example, the inductance l1 of the first inductance element L1, the inductance l2 of the second inductance element L2, the inductance l3 of the third inductance element L3, and the inductance l4 of the fourth inductance element L4 are preferably set at the following values, for example. The other conditions are described later.

l1: about 6.8 nH
l2: about 2 nH
l3: about 70 nH
l4: about 3.5 nH

When the switch SW selects the third inductance element L3 side, the resonant frequency of the radiation conductor 10 is preferably about 730 MHz, for example. When the switch SW selects the fourth inductance element L4 side, the resonant frequency of the radiation conductor 10 is preferably about 930 MHz, for example.

Figure 2A:
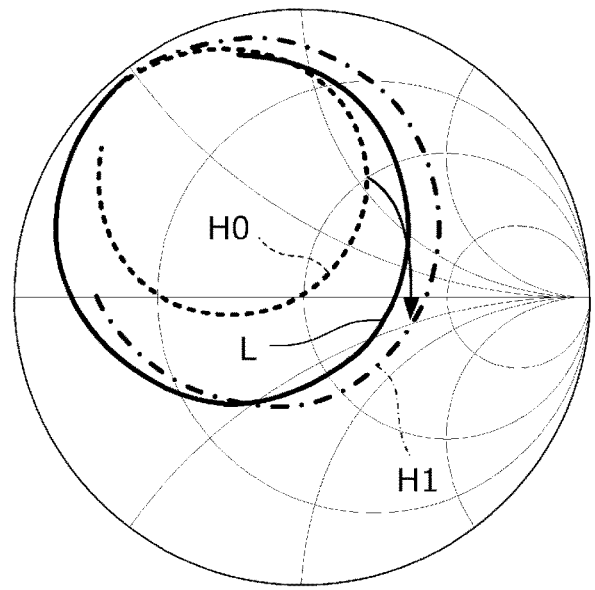
FIG. 2A illustrates a reflection coefficient viewed from a feeder circuit 20 towards a radiation conductor 10 in FIG. 1 on a Smith chart.
Figure 2B:
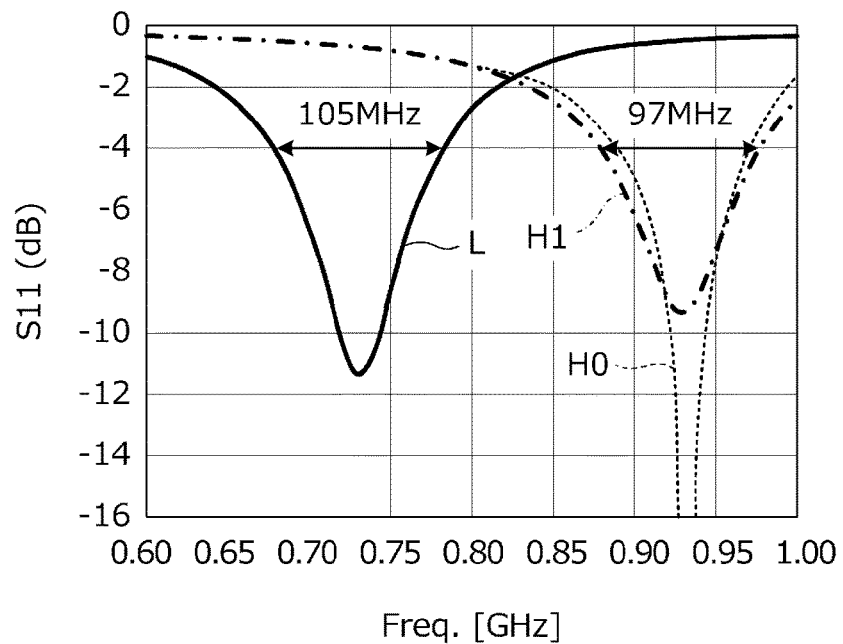
FIG. 2B illustrates frequency characteristics of its return loss.

FIG. 2A illustrates a reflection coefficient viewed from the feeder circuit 20 towards the radiation conductor 10 in FIG. 1 on a Smith chart, and FIG. 2B illustrates frequency characteristics of its return loss. Curves L in FIGS. 2A and 2B represent characteristics in a case in which the frequency is swept when the frequency-characteristics adjusting circuit 40 is in a first state (state in which an inductive reactance is large). Curves H1 in FIGS. 2A and 2B represent characteristics in a case in which the frequency is swept when the frequency-characteristics adjusting circuit 40 is in a second state (state in which the inductive reactance is small). Curves H0 in FIGS. 2A and 2B represent characteristics in a case in which the frequency is swept when the above-described coefficient k of coupling is zero and the frequency-characteristics adjusting circuit 40 is in the second state (state in which the inductive reactance is small). That is, the curves H0 are the same as the curves H in FIGS. 14A and 14B illustrated as the comparative example.

When the switch SW is set to the second state and the current flowing in the second inductance element L2 increases, the effective inductance of the first inductance element L1 increases. The curve H0 in FIG. 2A moves in the direction indicated by the arrow (along a conductance circle) and becomes the trajectory indicated as the curve H1.

In this example, when the switch SW selects the third inductance element L3, the resonant frequency of the radiation conductor 10 is about 730 MHz and the band width at a return loss of about −4 dB is about 105 MHz. When the switch SW selects the fourth inductance element L4, the resonant frequency of the radiation conductor 10 is about 930 MHz and the band width at a return loss of about −4 dB is about 97 MHz.

Figure 14A:
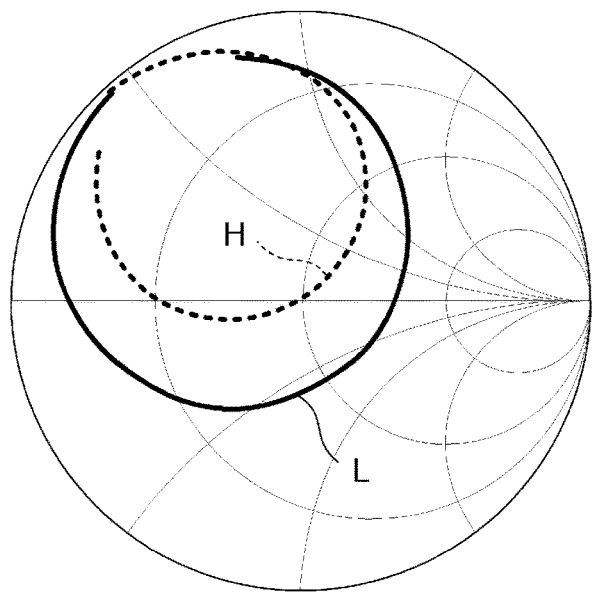
FIG. 14A illustrates a reflection coefficient viewed from a feeder circuit 20 toward a radiation conductor 10 in FIG. 13 on a Smith chart.
Figure 14B:
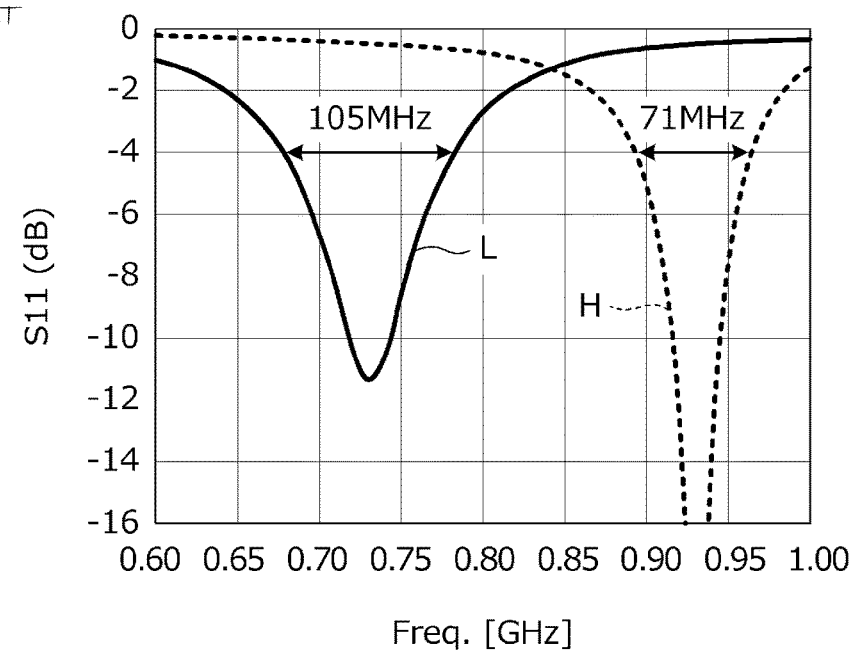
FIG. 14B illustrates frequency characteristics of its return loss.

In comparison with the comparative example illustrated in FIGS. 14A and 14B, the return loss characteristics on a lower frequency side (center frequency of about 730 MHz) are the same or substantially the same, whereas the return loss characteristics on a higher frequency side (center frequency of about 930 MHz) are different. That is, the wide-band characteristics are maintained even on the higher frequency side to the same or substantially the same degree as those on the lower frequency side. Here, the band in which the center frequency is about 730 MHz corresponds to, for example, LTE band 28, and the band in which the center frequency is about 930 MHz corresponds to, for example, a frequency band of GSM (registered trademark) 900.

Figure 3:
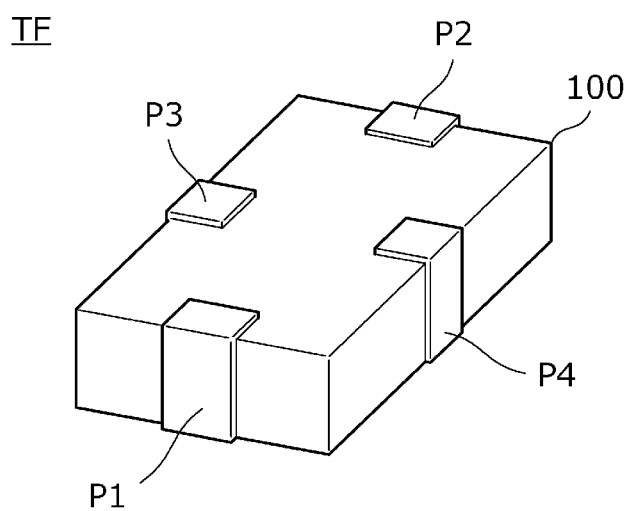
FIG. 3 is an external perspective view of a transformer TF.

FIG. 3 is an external perspective view of a transformer TF. FIG. 4 includes plan views of layers in the transformer TF. The transformer TF includes a plurality of insulating bases S1 to S7 on which various conductive patterns are disposed. Examples of the "various conductive patterns" include a conductive pattern disposed on a surface of a base, a via conductor disposed inside a layer, and a conductor disposed on an end face of a multilayer body.

The upper surface of the base S1 corresponds to a mounting surface (lower surface) of a multilayer body 100. Terminals P1, P2, P3, and P4 are disposed on the bases S1 and S7.

Conductors L2B, L2A, L1C, L1B, and L1A are disposed on the bases S2, S3, S4, S5, and S6, respectively.

A first end of the conductor L1A is connected to the first terminal P1. A second end of the conductor L1A is connected to a first end of the conductor L1B with a via conductor V1 interposed therebetween. A second end of the conductor L1B is connected to a first end of the conductor L1C with a via conductor V2 interposed therebetween. A second end of the conductor L1C is connected to the fourth terminal P4. A first end of the conductor L2A is connected to the third terminal P3. A second end of the conductor L2A is connected to a first end of the conductor L2B with a via conductor V3 interposed therebetween. A second end of the conductor L2B is connected to the second terminal P2.

The conductors L1A, L1B, and L1C and via conductors V1 and V2 define the first inductance element L1. The conductors L2A and L2B and via conductor V3 define the second inductance element L2. Accordingly, the transformer TF in which the first inductance element L1 is connected between the terminals P1 and P4 and the second inductance element L2 is connected between the terminals P2 and P3 is provided.

The base layers in the multilayer body 100 may preferably be, for example, a nonmagnetic ceramic multilayer body made of low temperature co-fired ceramics (LTCC) or other suitable ceramic material, or may preferably be a resin multilayer body made of a resin material, such as polyimide or liquid crystal polymer, for example. Because the base layers are nonmagnetic (are not magnetic ferrite), the transformer TF is able to be used as a transformer and phase shifter with a predetermined inductance and a predetermined coefficient of coupling even in a high frequency band exceeding several hundred MHz The various conductive patterns described above are preferably made of a conductive material primarily including silver or copper and having a small specific resistance, for example. When the base layer is ceramic, the patterns may be formed by, for example, screen-printing and firing of conductive paste having silver or copper as the main ingredient. When the base layer is made of resin, the patterns may be formed by, for example, patterning by etching or other suitable process of metal foil, such as aluminum foil or copper foil.

The first inductance element L1 and second inductance element L2 preferably have the same or substantially the same inner and outer diameters, and their coil winding axes are the same or substantially the same, i.e., coaxial. The inductance of the first inductance element L1 is able to be defined by the numbers of coil turns of the conductors L1A, L1B, L1C, and the like. The inductance of the second inductance element L2 is able to be defined by the numbers of coil turns of the conductors L2A, L2B, and the like. The coefficient of coupling between the first inductance element L1 and second inductance element L2 is able to be defined by the interlayer distance between the conductors L1C and L2A, the displacement between the winding axis of the first inductance element L1 and that of the second inductance element L2, and the like.

Figure 5A:
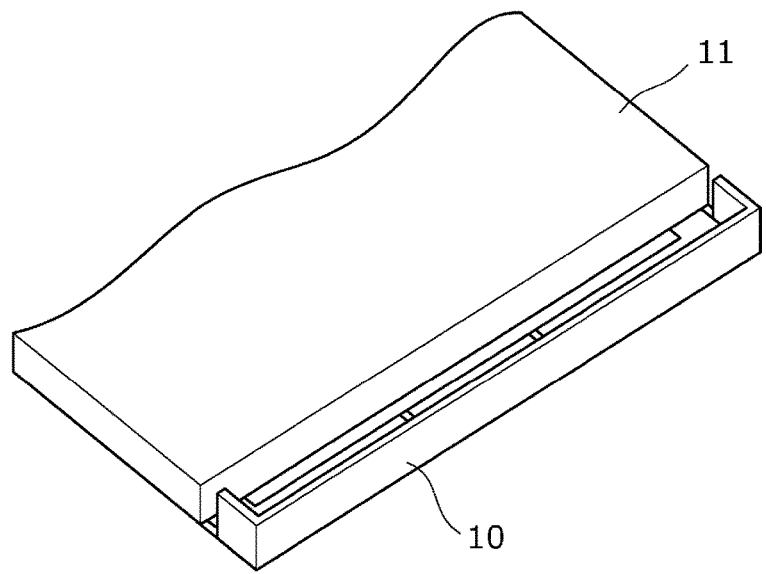
FIG. 5A is a perspective view that illustrates a structure of the radiation conductor 10 and a ground conductor 11 included in the antenna circuit in the first preferred embodiment of the present invention.
Figure 5B:
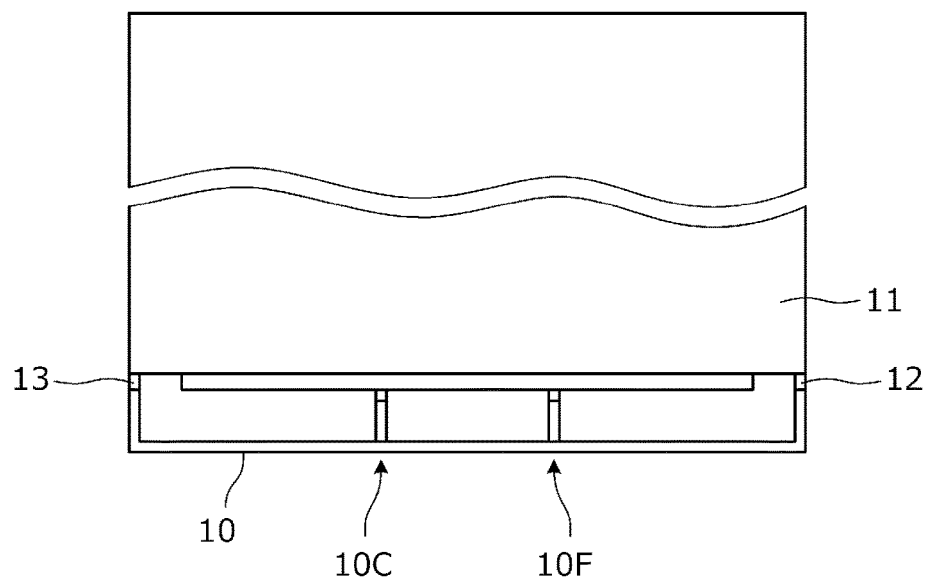
FIG. 5B is a plan view thereof.
Figure 6:
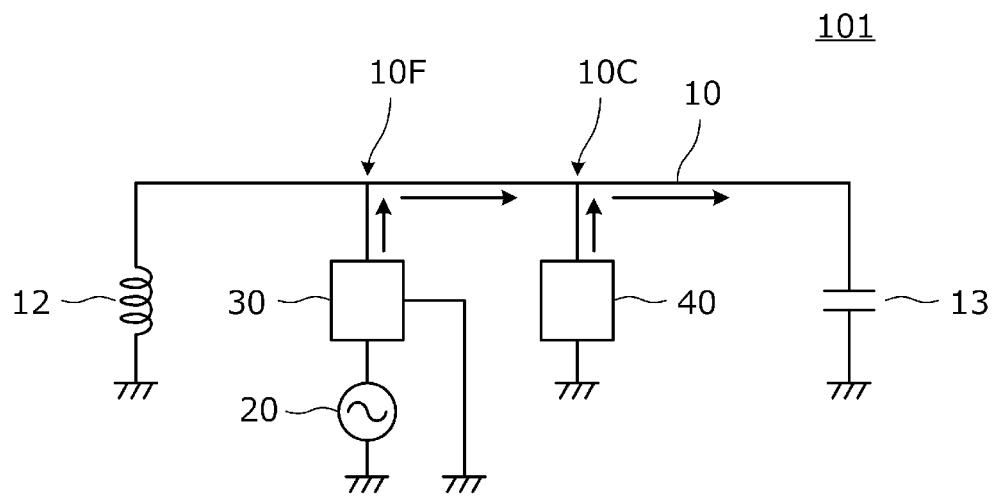
FIG. 6 is a circuit diagram of an antenna circuit 101 according to the first preferred embodiment of the present invention.

FIG. 5A is a perspective view that illustrates a structure of the radiation conductor 10 and ground conductor 11 included in the antenna circuit in the present preferred embodiment, and FIG. 5B is a plan view thereof. The radiation conductor 10 and ground conductor 11 are included in a metal portion of a casing of the communication device. FIG. 6 is a circuit diagram of the antenna circuit 101.

A capacitor 13 is connected between a first end of the radiation conductor 10 and the ground conductor. An inductor 12 is connected between a second end of the radiation conductor 10 and the ground conductor. The arrows in FIG. 6 indicate example paths and directions of currents.

In one example, the capacitor 13 may preferably be equal to or larger than about 0.2 pF and smaller than about 1 pF (for example, about 0.6 pF) and have high impedance in a communication frequency band. In one example, the inductor 12 may preferably be smaller than about 60 nH and equal to or larger than about 15 nH (for example, about 19 nH) and have high impedance in a communication frequency band. Thus, the first end and second end of the radiation conductor 10 equally function as open ends. With this structure, the resonant frequency of the antenna is able to be set at a desired frequency by the values of the capacitor 13 and inductor 12 without changing the shape of the radiation electrode.

Second Preferred Embodiment

In a second preferred embodiment of the present invention, an antenna circuit in which a transmission line is connected to a matching circuit is illustrated.

Figure 7:
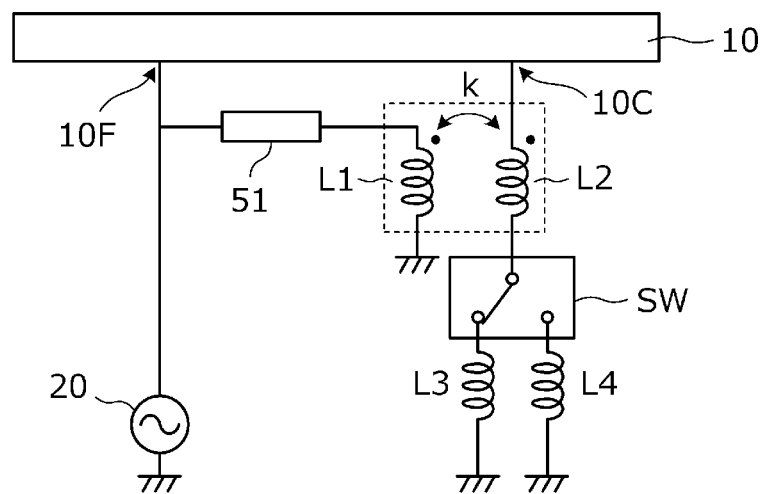
FIG. 7 is a circuit diagram of an antenna circuit 102 according to a second preferred embodiment of the present invention.

FIG. 7 is a circuit diagram of an antenna circuit 102 according to the second preferred embodiment. The antenna circuit 102 differs from the antenna circuit 101 illustrated in FIG. 1 in that it includes a transmission line 51. In the antenna circuit 102, the first end of the first inductance element L1 is grounded, and the transmission line 51 is disposed between the feeder circuit 20 or feeding port 10F and the second end of the first inductance element L1.

With the configuration of the antenna circuit 102, even when the distance between the feeding port 10F and frequency-characteristics adjustment port 10C is relatively long, the first inductance element L1 and the second inductance element L2, which are connected to the ports, respectively, are able to be magnetically coupled. If a reactance component in the matching circuit varies because of the transmission line 51, the inductance of the first inductance element L1 may be changed in response to that variation.

According to the present preferred embodiment, the transmission line 51 does not affect the frequency-characteristics adjusting circuit including the second inductance element L2, the switch SW, the third inductance element L3, and the fourth inductance element L4.

Third Preferred Embodiment

In a third preferred embodiment of the present invention, an antenna circuit in which a transmission line is connected to a frequency-characteristics adjusting circuit is illustrated.

Figure 8:
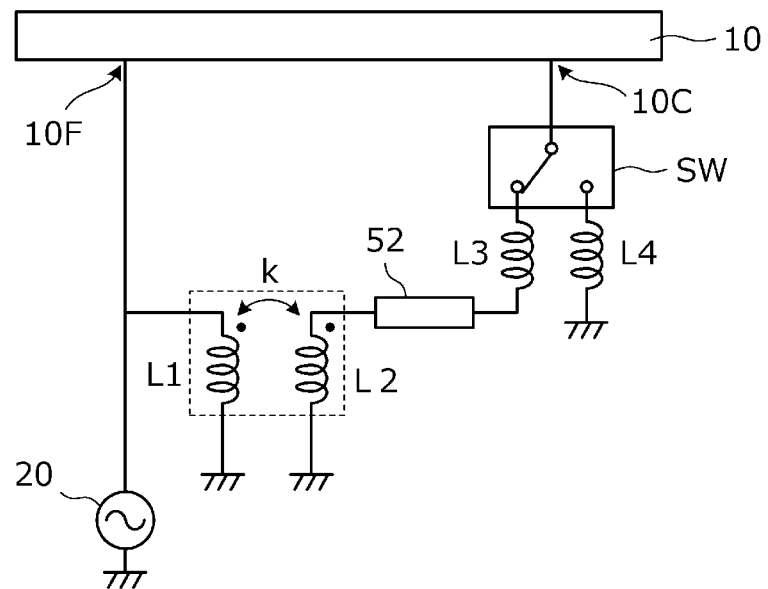
FIG. 8 is a circuit diagram of an antenna circuit 103 according to a third preferred embodiment of the present invention.

FIG. 8 is a circuit diagram of an antenna circuit 103 according to the third preferred embodiment. The antenna circuit 103 differs from the antenna circuit 101 illustrated in FIG. 1 in that it includes a transmission line 52. In the antenna circuit 103, the first end of the second inductance element L2 is grounded, and the transmission line 52 is disposed between the switch SW and the second end of the second inductance element L2. The switch SW is connected to the frequency-characteristics adjustment port 10C in the radiation conductor 10, and the transmission line 52 is connected between the third inductance element L3 and second inductance element L2. As described above, the transmission line is able to be disposed in the frequency-characteristics adjusting circuit.

According to the present preferred embodiment, the frequency-characteristics adjustment port 10C is able to be switched between "the state in which it is connected to the fourth inductance element L4" and "the state in which it is connected to the third inductance element L3 and second inductance element L2" by the switch SW. Accordingly, the reactance connected to the frequency-characteristics adjustment port 10C is able to be changed to a large extent, and this enables an extended frequency variable range.

According to the present preferred embodiment, the antenna circuit is also applicable to the case in which it is necessary to reduce the inductance of the first inductance element L1 in order to increase the depth of antenna matching (depth of a valley of a return loss curve).

Fourth Preferred Embodiment

In a fourth preferred embodiment of the present invention, an antenna circuit in which an inductance element is connected to the frequency-characteristics adjustment port without a switch interposed therebetween is illustrated.

Figure 9:
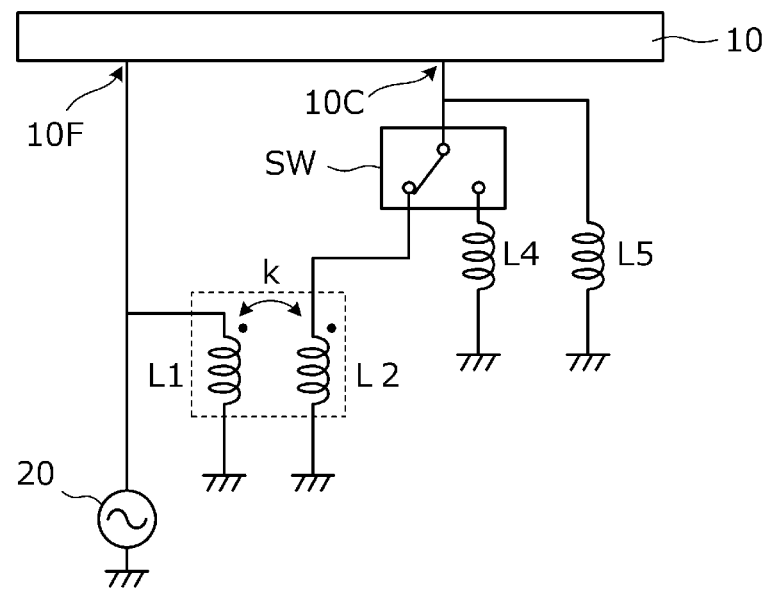
FIG. 9 is a circuit diagram of an antenna circuit 104A according to a fourth preferred embodiment of the present invention.

FIG. 9 is a circuit diagram of an antenna circuit 104A according to the fourth preferred embodiment. Unlike the antenna circuit 103 illustrated in FIG. 8, a fifth inductance element L5 is connected directly between the frequency-characteristics adjustment port 10C and the ground (without the switch SW interposed therebetween). Unlike the antenna circuit 103 illustrated in FIG. 8, the antenna circuit 104A does not include the transmission line 52 or the third inductance element L3. Accordingly, the switch SW selects one of the second inductance element L2 and the fourth inductance element L4.

Figure 10:
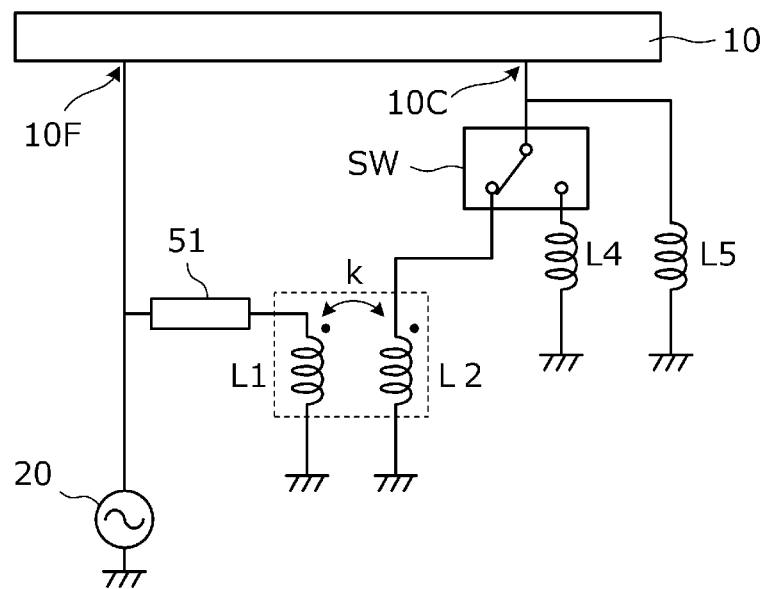
FIG. 10 is a circuit diagram of another antenna circuit 104B according to a modification of the fourth preferred embodiment of the present invention.

FIG. 10 is a circuit diagram of a modified antenna circuit 104B according to the fourth preferred embodiment. The antenna circuit 104B is an example in which the transmission line 51 is included in the antenna circuit 104A.

The present preferred embodiment preferably includes one or more of the characteristics described below.

In the state in which the switch SW selects the second inductance element L2, because only the second inductance element L2 is connected between the frequency-characteristics adjustment port 10C and the ground with the switch SW interposed therebetween, the inductance of the second inductance element L2 is able to be set to a large value. Therefore, even when the coupling is not strong, the amount of control of the effective reactance of the first inductance element L1 is increased.

When the second inductance element L2 has an inductance smaller than that of the fourth inductance element L4 and the current flowing in the second inductance element L2 is relatively large, the amount of variation in the effective reactance of the first inductance element L1 is increased.

Because the fifth inductance element L5 is provided, the current flowing through the switch SW is able to be reduced, and the loss at the switch SW is able to be decreased.

Fifth Preferred Embodiment

In a fifth preferred embodiment of the present invention, an antenna circuit including a matching circuit having a configuration different from that in each of the above-described preferred embodiments is illustrated.

Figure 11:
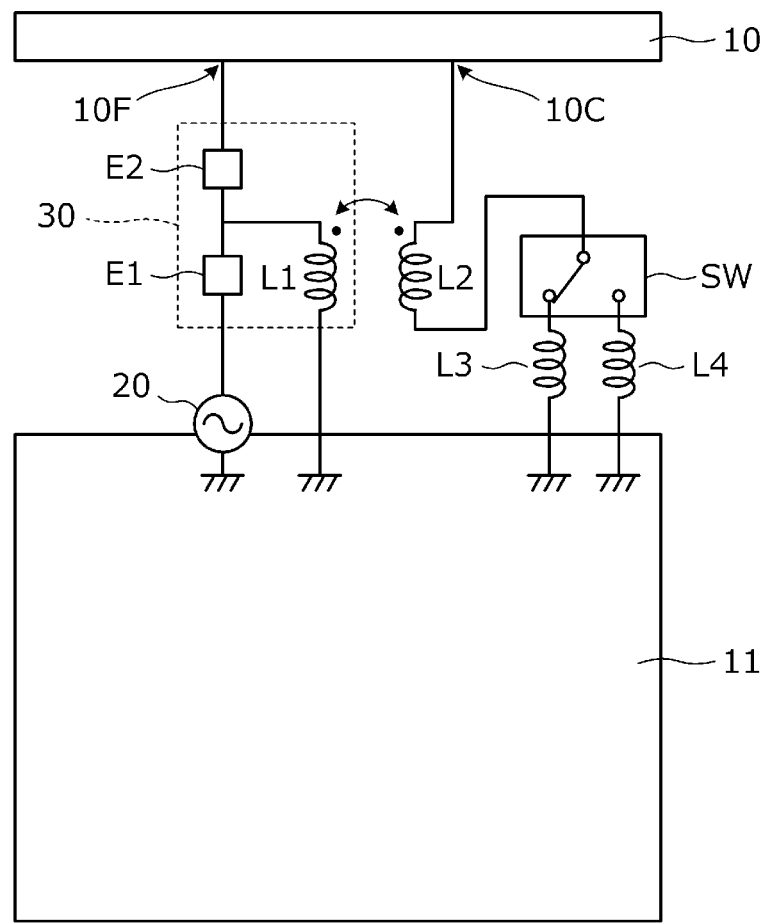
FIG. 11 is a circuit diagram of an antenna circuit 105 according to a fifth preferred embodiment of the present invention.

FIG. 11 is a circuit diagram of an antenna circuit 105 according to the fifth preferred embodiment. The matching circuit is disposed between the feeding port 10F in the radiation conductor 10 and the feeder circuit 20. The matching circuit 30 includes elements E1 and E2 connected in series between the feeder circuit 20 and the feeding port 10F and the first inductance element L1 connected in shunt with the ground.

As described above, the matching circuit may include not only the first inductance element L1 connected in shunt with the ground but also reactance elements connected in series, such as inductors or capacitors.

Sixth Preferred Embodiment

In a sixth preferred embodiment of the present invention, an example of a communication device is illustrated.

Figure 12:
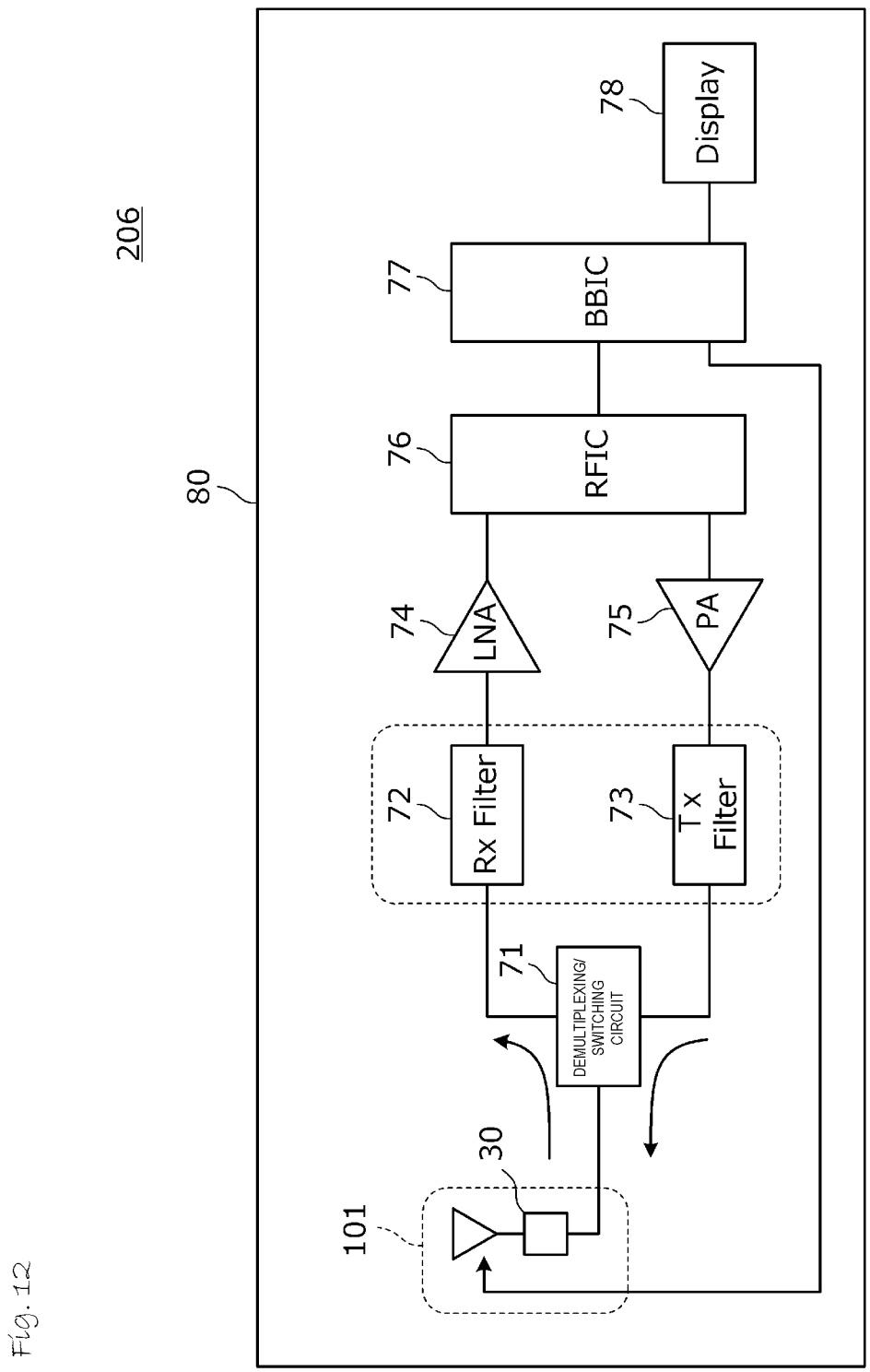
FIG. 12 is a block diagram of a communication device 206 according to a sixth preferred embodiment of the present invention.
Figure 13:
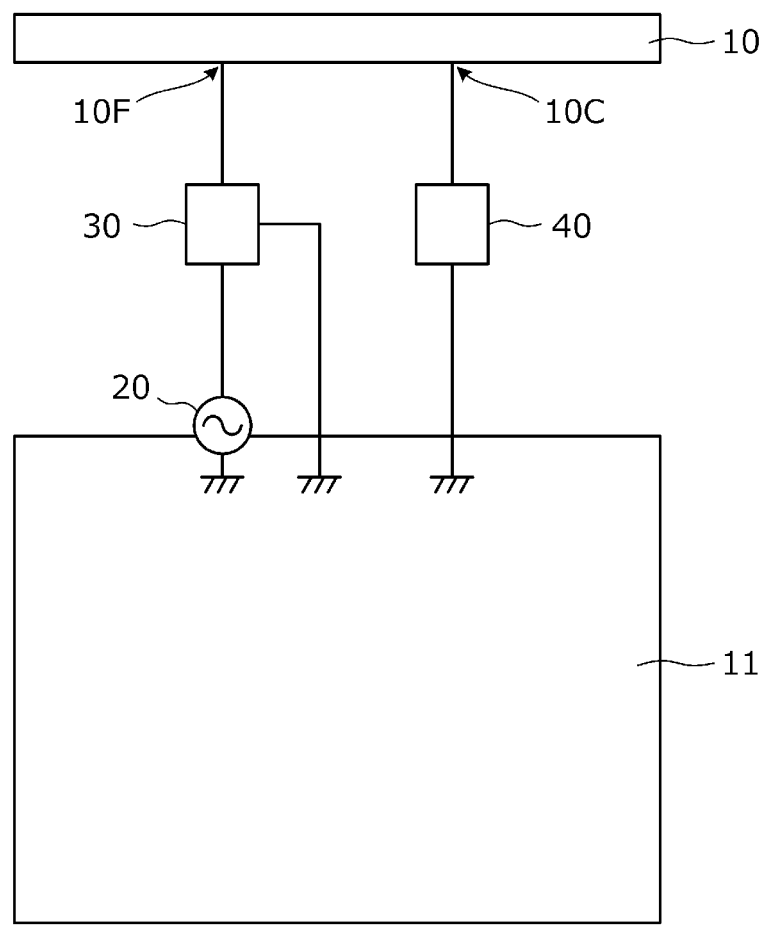
FIG. 13 illustrates an example of a known antenna circuit.

FIG. 12 is a block diagram of a communication device 206 according to the sixth preferred embodiment. One example of the communication device 206 may be a cellular phone terminal. The antenna circuit 101 is preferably the antenna circuit 101 illustrated in the first preferred embodiment, for example. A low-noise amplifier 74 is disposed between a radio frequency integrated circuit (RFIC) 76 and a reception filter 72. A power amplifier 75 is disposed between the RFIC 76 and a transmission filter 73. A base-band IC 77 is connected to the RFIC 76 and a display device 78.

The base-band IC 77 performs switching in the frequency-characteristics adjusting circuit in the antenna circuit 101 in accordance with the communication frequency band. With this configuration, the reactance of the variable reactance circuit is able to be defined, and return loss characteristics in the communication frequency band is able to be controlled to be predetermined characteristics.

Other Preferred Embodiments

In the above-described preferred embodiments of the present invention, the variable reactance circuit included in the frequency-characteristics adjusting circuit 40 preferably changes the inductive reactance. The frequency-characteristics adjusting circuit 40 may include a capacitor, and the variable reactance circuit may change the capacitive reactance, for example.

In the above-described preferred embodiments of the present invention, the switch SW is illustrated as a single-pole double-throw (SPDT) switch as an example. The switch SW may be a switch capable of switching among three or more states. With this switch, the depth of matching is able to be set for each of the three or more frequency bands.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An antenna circuit comprising:
a radiation conductor;
a matching circuit disposed between a feeding port in the radiation conductor and a feeder circuit; and
a frequency-characteristics adjusting circuit connected between a frequency-characteristics adjustment port in the radiation conductor and a ground, the frequency-characteristics adjusting circuit including a variable reactance circuit; wherein
the matching circuit includes a first inductance element connected in shunt;
the frequency-characteristics adjusting circuit includes a second inductance element; and
the first inductance element and the second inductance element are magnetically coupled to each other.

2. The antenna circuit according to claim 1, wherein the first inductance element and the second inductance element are coupled with polarity at which inductances thereof are increased.

3. The antenna circuit according to claim 1, wherein
the variable reactance circuit includes a plurality of reactance elements and a switch that selects one of the plurality of reactance elements; and
the second inductance element is connected between the switch and the frequency-characteristics adjustment port in the radiation conductor.

4. The antenna circuit according to claim 1, wherein
the variable reactance circuit includes a plurality of reactance elements and a switch that selects one of the plurality of reactance elements; and
the second inductance element is connected between the switch and the ground.

5. The antenna circuit according to claim 4, wherein
a first end of the second inductance element is grounded; and
the antenna circuit further includes a transmission line connected between the switch and a second end of the second inductance element.

6. The antenna circuit according to claim 1, wherein
a first end of the first inductance element is grounded; and
the antenna circuit further includes a transmission line connected between the feeder circuit or the feeding port and a second end of the first inductance element.

7. The antenna circuit according to claim 1, wherein the first inductance element and the second inductance element include a plurality of dielectric bases that are laminated and conductive patterns provided on the plurality of dielectric bases, and a one-chip component including the first inductance element and the second inductance element is provided.

8. The antenna circuit according to claim 1, wherein the frequency-characteristics adjusting circuit further includes a third inductance element, a fourth inductance element, and a switch.

9. The antenna circuit according to claim 1, wherein the first inductance element and second inductance element define a transformer.

10. A communication device comprising:
an antenna circuit; and
a feeder circuit connected to the antenna circuit; wherein the antenna circuit includes:
 a radiation conductor;
 a matching circuit disposed between a feeding port in the radiation conductor and a feeder circuit; and
 a frequency-characteristics adjusting circuit connected between a frequency-characteristics adjustment port in the radiation conductor and a ground, the frequency-characteristics adjusting circuit including a variable reactance circuit;
the matching circuit includes a first inductance element connected in shunt;
the frequency-characteristics adjusting circuit includes a second inductance element; and
the first inductance element and the second inductance element are magnetically coupled to each other.

11. The communication device according to claim 10, wherein the first inductance element and the second inductance element are coupled with polarity at which their inductances are increased.

12. The communication device according to claim 10, wherein
the variable reactance circuit includes a plurality of reactance elements and a switch that selects one of the plurality of reactance elements; and
the second inductance element is connected between the switch and the frequency-characteristics adjustment port in the radiation conductor.

13. The communication device according to claim 10, wherein
the variable reactance circuit includes a plurality of reactance elements and a switch that selects one of the plurality of reactance elements; and
the second inductance element is connected between the switch and the ground.

14. The communication device according to claim 13, wherein
a first end of the second inductance element is grounded; and
the antenna circuit further includes a transmission line connected between the switch and a second end of the second inductance element.

15. The communication device according to claim 10, wherein
a first end of the first inductance element is grounded; and
the antenna circuit further includes a transmission line connected between the feeder circuit or the feeding port and a second end of the first inductance element.

16. The communication device according to claim 10, wherein the first inductance element and the second inductance element include a plurality of dielectric bases that are laminated and conductive patterns provided on the plurality of dielectric bases, and a one-chip component including the first inductance element and the second inductance element is provided.

17. The communication device according to claim 10, wherein the frequency-characteristics adjusting circuit further includes a third inductance element, a fourth inductance element, and a switch.

18. The communication device according to claim 10, wherein the first inductance element and second inductance element define a transformer.

19. The communication device according to claim 10, further comprising:
a radio frequency integrated circuit;
a reception filter;
a transmission filter;
a display device;
a low-noise amplifier disposed between the radio frequency integrated circuit and the reception filter;
a power amplifier disposed between the radio frequency integrated circuit and the transmission filter; and
a base-band IC connected to the radio frequency integrated circuit and the display device.

20. The communication device according to claim 19, wherein the communication device is a cellular phone terminal.

* * * * *